US011915951B2

(12) United States Patent
Kobayashi et al.

(10) Patent No.: US 11,915,951 B2
(45) Date of Patent: Feb. 27, 2024

(54) PLASMA PROCESSING METHOD

(71) Applicant: HITACHI HIGH-TECH CORPORATION, Tokyo (JP)

(72) Inventors: Hiroyuki Kobayashi, Tokyo (JP); Nobuya Miyoshi, Tokyo (JP); Kazunori Shinoda, Tokyo (JP); Tatehito Usui, Tokyo (JP); Naoyuki Kofuji, Tokyo (JP); Yutaka Kouzuma, Tokyo (JP); Tomoyuki Watanabe, Tokyo (JP); Kenetsu Yokogawa, Tokyo (JP); Satoshi Sakai, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 270 days.

(21) Appl. No.: 16/913,010

(22) Filed: Jun. 26, 2020

(65) Prior Publication Data
US 2020/0328099 A1    Oct. 15, 2020

Related U.S. Application Data

(63) Continuation of application No. 15/718,948, filed on Sep. 28, 2017, now abandoned.

(30) Foreign Application Priority Data

Oct. 28, 2016 (JP) .................................. 2016-211207

(51) Int. Cl.
*H01L 21/67* (2006.01)
*H01J 37/32* (2006.01)
(Continued)

(52) U.S. Cl.
CPC ...... *H01L 21/67248* (2013.01); *C23C 16/482* (2013.01); *H01J 37/3299* (2013.01);
(Continued)

(58) Field of Classification Search
CPC .......... H01J 37/32449; H01J 37/32724; H01J 37/32917; H01J 37/32935;
(Continued)

(56) References Cited

U.S. PATENT DOCUMENTS 3,562,677 A   2/1971  Gunderson
5,728,253 A   3/1998  Saito et al.
(Continued)

FOREIGN PATENT DOCUMENTS

CN     102738039 A      10/2012
DE  102006009480 A1 *  8/2007  ............. B64D 15/20
(Continued)

OTHER PUBLICATIONS

Office Action dated Feb. 28, 2020 in U.S. Appl. No. 15/718,948.
(Continued)

*Primary Examiner* — David E Smith
(74) *Attorney, Agent, or Firm* — Miles & Stockbridge, P.C.

(57) ABSTRACT

A plasma processing apparatus includes a stage disposed in a processing chamber for mounting a wafer, a plasma generation chamber disposed above the processing chamber for plasma generation using process gas, a plate member having multiple introduction holes, made of a dielectric material, disposed above the stage and between the processing chamber and the plasma generation chamber, and a lamp disposed around the plate member for heating the wafer. The plasma processing apparatus further includes an external IR light source, an emission fiber arranged in the stage, that outputs IR light from the external IR light source toward a wafer bottom, and a light collection fiber for collecting IR light from the wafer. Data obtained using only IR light from the lamp is subtracted from data obtained also using IR light (Continued)

from the external IR light source during heating of the wafer. Thus, a wafer temperature is determined.

5 Claims, 14 Drawing Sheets

(51) Int. Cl.
  *C23C 16/48* (2006.01)
  *H01L 21/66* (2006.01)

(52) U.S. Cl.
  CPC .. *H01J 37/32449* (2013.01); *H01J 37/32724* (2013.01); *H01J 37/32917* (2013.01); *H01J 37/32935* (2013.01); *H01J 37/32972* (2013.01); *H01L 21/67069* (2013.01); *H01L 21/67098* (2013.01); *H01L 21/67115* (2013.01); *H01L 21/67207* (2013.01); *H01L 22/12* (2013.01); *H01L 22/20* (2013.01); *H01J 2237/2001* (2013.01); *H01J 2237/24585* (2013.01); *H01J 2237/334* (2013.01)

(58) Field of Classification Search
  CPC ............ H01J 37/32972; H01J 37/3299; H01L 21/627248; H01L 21/67069; H01L 21/67098; H01L 21/67115
  See application file for complete search history.

(56) References Cited

U.S. PATENT DOCUMENTS

| | | | |
|---|---|---|---|
| 6,313,441 B1 | 11/2001 | Schaper et al. | |
| 7,582,491 B2 | 9/2009 | Sasaki et al. | |
| 9,070,725 B2 * | 6/2015 | Matsudo | G01K 11/00 |
| 9,239,265 B2 | 1/2016 | Taylor, II et al. | |
| 2002/0048019 A1 | 4/2002 | Sui et al. | |
| 2002/1089757 | 12/2002 | Denton et al. | |
| 2004/0156026 A1 | 8/2004 | Kamiya | |
| 2004/0185670 A1 | 9/2004 | Hamelin et al. | |
| 2005/0106876 A1 | 5/2005 | Taylor et al. | |
| 2007/0291818 A1 | 12/2007 | Yasuda et al. | |
| 2008/0093315 A1 | 4/2008 | Okabe | |
| 2008/0102001 A1 | 5/2008 | Chandrachood et al. | |
| 2008/0268645 A1 | 10/2008 | Kao et al. | |
| 2012/0064247 A1 | 3/2012 | Hiwa et al. | |
| 2012/0225566 A1 | 9/2012 | Hamano et al. | |
| 2013/0343426 A1 | 12/2013 | Gurary et al. | |
| 2014/0251945 A1 | 9/2014 | Nishimura et al. | |
| 2015/0118858 A1 | 4/2015 | Takaba | |
| 2015/0270140 A1 | 9/2015 | Gupta et al. | |
| 2015/0270148 A1 * | 9/2015 | Shinoda | H01L 21/02057 |
| | | | 156/345.35 |
| 2017/0125261 A1 | 5/2017 | Miyama et al. | |
| 2017/0133233 A1 | 5/2017 | Sato et al. | |
| 2017/0229290 A1 | 8/2017 | Kobayashi et al. | |
| 2018/0090345 A1 | 3/2018 | Kouzuma et al. | |
| 2018/0122665 A1 | 5/2018 | Kobayashi et al. | |
| 2018/0158526 A1 | 6/2018 | Kim et al. | |
| 2018/0197748 A1 | 7/2018 | Nishimura et al. | |
| 2019/0027374 A1 | 1/2019 | Sim et al. | |
| 2019/0028725 A1 | 1/2019 | Zhang et al. | |
| 2019/0198299 A1 | 6/2019 | Watanabe et al. | |
| 2019/0287825 A1 | 9/2019 | Tanaka | |
| 2020/0328099 A1 | 10/2020 | Kobayashi et al. | |
| 2021/0104414 A1 | 4/2021 | Panagopoulos et al. | |
| 2021/0366791 A1 | 11/2021 | Tanaka | |
| 2023/0005749 A1 | 1/2023 | Yamaguchi et al. | |

FOREIGN PATENT DOCUMENTS

| | | | | |
|---|---|---|---|---|
| DE | 102006009460 A1 * | 9/2007 | ........... | C23C 14/541 |
| EP | 1670041 A1 | 6/2006 | | |
| JP | 2000208524 A | 7/2000 | | |
| JP | 2002164299 A | 6/2002 | | |
| JP | 2003-519380 A | 6/2003 | | |
| JP | 2003347278 A | 12/2003 | | |
| JP | 2004063670 A | 2/2004 | | |
| JP | 2004518727 A | 6/2004 | | |
| JP | 2006054214 A | 2/2006 | | |
| JP | 2007063583 A * | 3/2007 | | |
| JP | 2007234859 A | 9/2007 | | |
| JP | 2007263583 A * | 10/2007 | ............. | H05B 6/062 |
| JP | 2011176128 A | 9/2011 | | |
| JP | 2012231001 A | 11/2012 | | |
| JP | 2014170894 A | 9/2014 | | |
| JP | 2015012243 A | 1/2015 | | |
| JP | 2015522953 A | 8/2015 | | |
| JP | 2015185594 A | 10/2015 | | |
| JP | 2016178257 A | 10/2016 | | |
| JP | 2017084965 A | 5/2017 | | |
| JP | 2017143186 A | 8/2017 | | |
| JP | 2018056248 A | 4/2018 | | |
| JP | 2018073962 A | 5/2018 | | |
| JP | 2018-092116 A | 6/2018 | | |
| JP | 2018-107202 A | 7/2018 | | |
| JP | 2018110229 A | 7/2018 | | |
| JP | 2018110230 A | 7/2018 | | |
| JP | 2018113306 A | 7/2018 | | |
| JP | 2019161157 A | 9/2019 | | |
| KR | 20170114066 A | 10/2017 | | |
| KR | 10-2018-0095938 A | 8/2018 | | |
| TW | 202205426 A | 2/2022 | | |
| WO | 02054460 A1 | 7/2002 | | |
| WO | WO-2010008721 A2 * | 1/2010 | ............. | G01J 5/0003 |
| WO | 2013168509 A1 | 11/2013 | | |

OTHER PUBLICATIONS

Office Action dated Mar. 14, 2022 in U.S. Appl. No. 16/495,515.
Office Action dated Sep. 29, 2021 in U.S. Appl. No. 16/495,515.
Office Action dated Oct. 27, 2020 in Japanese Application No. 2019-546055.
Search Report dated Apr. 23, 2019 in International Application No. PCT/JP2019/003601.
Office Action dated Mar. 16, 2022 in U.S. Appl. No. 16/495,369.
Office Action dated Dec. 24, 2022 in Korean Application No. 10-2019-7026612.
Search Report dated Jan. 29, 2019 in International Application No. PCT/JP2018/043542.
Office Action dated Aug. 17, 2022 in U.S. Appl. No. 16/495,369.
W. E. Hoke et al., J. Vac. Sci. Technol. B28, C3F5 (2010).
Search Report dated May 31, 2022 in International Application No. PCT/JP2022/011898.
Office Action dated Mar. 1, 2023 in U.S. Appl. No. 16/495,369.
Office Action dated Apr. 28, 2023 in Taiwanese Application No. 112105614.

* cited by examiner

PLASMA PROCESSING METHOD

BACKGROUND OF THE INVENTION

1. Field of the Invention

The present disclosure relates to a plasma processing method that uses plasma exposure and infrared (IR) heating to perform etching, and in particular to wafer temperature monitoring in the plasma processing method.

2. Description of the Related Art

In the field of semiconductor devices, demands for reduction in power consumption and for greater storage capacity have driven further dimension reduction and increased usage of three-dimensional device structure. Due to a complex non-planar structure, manufacturing a device having a three-dimensional structure uses not only conventional "vertical etching" (i.e., etching in a vertical direction perpendicular to the wafer surface), but also in many applications "isotropic etching" that also allows etching in a lateral direction.

Isotropic etching has conventionally been carried out using a wet process using a chemical solution. However, progress in dimension reduction has presented a problem of pattern collapse caused by surface tension of the chemical solution. To solve this problem, isotropic etching needs to be performed not by a conventional wet process that uses a chemical solution, but by a dry process that uses no chemical solution.

Examples of conventionally known technology for isotropic etching with high accuracy using a dry process include an etching process involving adsorption and desorption steps. This technology first performs an adsorption step. In the adsorption step, relatively highly reactive particles, such as radicals generated using plasma, are allowed to adsorb on a surface of a film layer that is to be etched of a sample in a form of substrate, such as a semiconductor wafer, to thus form a reaction layer on that surface by chemical reaction occurring therebetween.

A desorption step is then performed. In the desorption step, thermal or kinetic energy is applied on the sample or on the reaction layer to cause the reaction layer to be desorbed, and thus removed, from the sample surface. The target film layer is thus etched by alternately repeating these adsorption and desorption steps with a predetermined cycle period.

In the adsorption step of this conventional technology, the reaction layer formed on the surface and grown to a particular thickness acts to hinder radicals from reaching an interface between the etched layer and the reaction layer, thereby rapidly decelerating the growth of the reaction layer. Thus, use of an appropriately sufficient adsorption time enables a modified layer having a uniform thickness to be formed inside a complex pattern geometry even when variation exists in the amount of incoming radicals. This provides an advantage in that the etch depth can be maintained constant irrespective of the pattern geometry.

This conventional technology can also control the etch depth per cycle to be not greater than several nanometers, and thus provides an advantage in that the amount of work can be adjusted with dimensional accuracy of about several nanometers. This conventional technology also provides another advantage in that difference between the radical species needed to form a reaction layer on the surface of the etched layer, and the radical species that causes etching of a film desired to have a high selectivity (not to be removed) can be used to provide highly selective etching.

Examples of such known conventional technology include what is disclosed in JP 2015-185594 A. This conventional technology discloses a plasma processing apparatus including a vacuum vessel, a radical source disposed above the vacuum vessel, the radical source serving as a vessel containing a space for plasma generation, and a lamp disposed in a space between the vacuum vessel and the radical source, wherein the lamp generates and emits vacuum ultraviolet (UV) light.

In this conventional technology, the vacuum vessel includes a processing chamber, and the processing chamber is provided with a stage for mounting a wafer. Process gas is supplied to into a space in the radical source vessel, and is then activated to generate particles, and these particles are supplied on the upper surface of the wafer in the processing chamber through a gas inlet pipe communicating with the processing chamber. These particles are then allowed to adsorb on the upper surface to form a product layer. After this step, the lamp emits vacuum UV light into the processing chamber to decompose the product that has been formed on the wafer upper surface to desorb the product from the upper surface, thereby resulting in removal of the product layer. Thus, this conventional technology provides an example of etching technology that processes a target film layer on the wafer surface by alternately repeating the steps described above.

A technique using a lamp that emits vacuum UV light to the wafer as the conventional technology described above is not the only technique for removing the product layer formed by supply of highly reactive particles onto the upper surface of the wafer in the processing chamber. Another known technique is a technique having a configuration that heats the wafer (e.g., using IR light from an IR lamp) to desorb the product.

SUMMARY OF THE INVENTION

The process of alternating an adsorption step (product layer formation step) and a desorption step disclosed in the conventional technology described above, particularly the process of alternating an adsorption step and a step of heating and removing the product layer, requires determination of the temperature of the wafer and regulation of the temperature of the wafer to a value within a desired range based on the determination result to stabilize the process conditions to improve the yield as well as the accuracy in the geometry of wafer surface after processing.

For example, among the process conditions described above, the range of the temperature may be in a range of, for example, from −40° C. to 300° C. In this temperature range, it is desirable that the temperature of the wafer be determinable with high accuracy, or otherwise, information of the determined temperature of the wafer be fed back, and the temperature be regulated within a desired range based on the information to enable the temperature of the wafer to be determined as quickly as practical, in the step of desorbing the product from the wafer surface, particularly while the wafer is heated by emission of IR light from an IR lamp for desorption of the product. However, the conventional technology described above lacks sufficient foresight on the followings, and has thus suffered from a problem.

A problem exists in reducing an accuracy of determining the temperature of the wafer using IR light emitted from IR light source installed outside the processing chamber for detecting the temperature of the wafer, in case the IR light from the IR lamp for heating the wafer and IR light from the IR light source outside may be combined together. This presents a problem in that the geometry after processing as the result of the processing falls out of an accepted range, thereby reducing the yield, and/or that adjustment of the temperature to a value within a temperature range suitable for the processing needs a long time, thereby reducing the throughput of the processing.

It is therefore an object of the present invention to provide a plasma processing method capable of improving efficiency and accuracy of processing, and thus capable of increasing the yield in processing.

To this end, a method of processing a semiconductor wafer is provided that includes locating the semiconductor wafer on an upper surface of a sample stage disposed in a lower portion of a processing chamber inside a vessel, supplying a process gas into the processing chamber, absorbing particles generated by the process gas on a film disposed on an upper surface of the wafer to generate a product layer, desorbing the product layer, after the absorbing step, by heating the wafer using infrared (IR) light emitted from a lamp disposed above the sample stage, detecting IR light exiting from a rear surface of the wafer from an upper and out of a rear surface thereof, during a period in which the emission of the IR light by the lamp is lowered so that the product layer is not desorbed, after having passed through an inside of the semiconductor wafer, using a detector disposed below the upper surface of the sample stage, and detecting a characteristic change of intensities of the IR light in a plurality of wavelengths thereof, determining a temperature of the semiconductor wafer using a result of detecting a wavelength of the IR light in which the characteristic change occurred and data which is obtained before the processing of the semiconductor wafer and indicating a relationship between the temperature of the semiconductor wafer and the wavelength of the IR light in which the characteristic change occurred, and adjusting the temperature of the semiconductor wafer using the value obtained by the step of determining the temperature of the semiconductor wafer.

The present invention provides correct monitoring of the temperature of a wafer in heating and cooling cycles, and can thus increase repeatability of process based on the temperature determined.

DESCRIPTION OF THE PREFERRED EMBODIMENTS

A preferred embodiment of the present disclosure will now be described with reference to the drawings.

A preferred embodiment of the present disclosure will be described below with reference to FIGS. 1 to 17.

Figure 1:
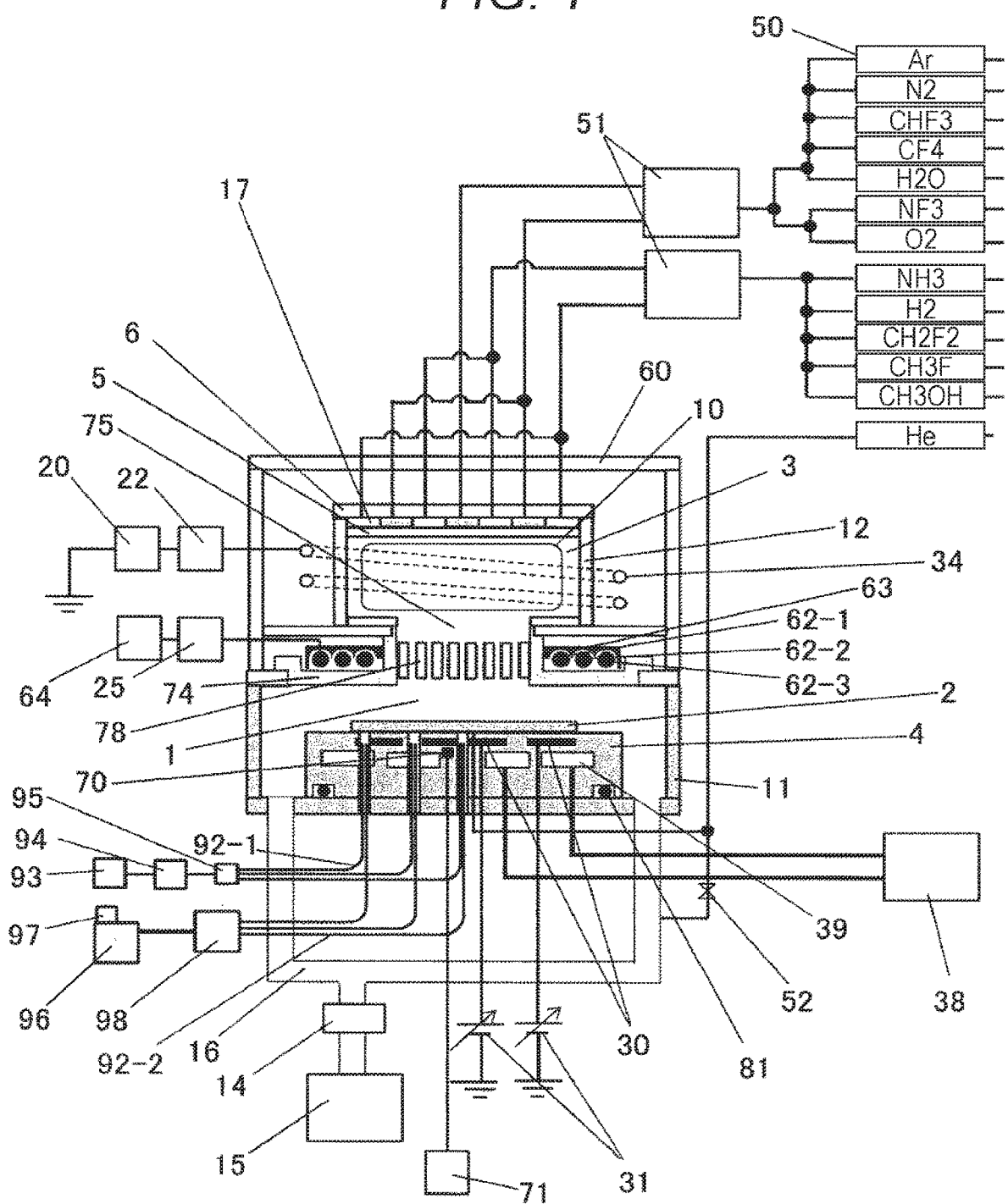
FIG. 1 is a diagram schematically illustrating a plasma processing apparatus according to an embodiment of the present disclosure.

FIG. 1 is a vertical cross-sectional view schematically illustrating a configuration of a plasma processing apparatus according to an embodiment of the present disclosure. The plasma processing apparatus of this embodiment includes a vacuum vessel having a processing chamber in a lower portion thereof. The plasma processing apparatus also includes a lamp that emits infrared (IR) light to a wafer on a stage included in the processing chamber to heat the wafer. The plasma processing apparatus further includes a discharge chamber, a flow channel, and a slit. The discharge chamber forms an upper portion of the vacuum vessel, and plasma is generated in the discharge chamber. The flow channel communicates between the discharge chamber and the processing chamber disposed under the discharge chamber. The slit has multiple gaps or holes to allow particles of highly reactive active species, such as radicals, generated through plasma generation to pass therethrough.

The plasma processing apparatus of this embodiment includes the processing chamber 1 in a base chamber 11 that forms a lower portion of the vacuum vessel. The processing chamber 1 includes a wafer stage 4 at an inner lower position of the processing chamber 1 for mounting a wafer 2 on top of the wafer stage 4. A plasma source, which uses inductively coupled plasma (ICP) discharge, is provided above the processing chamber 1.

A quartz chamber 12 having a cylindrical shape, which forms an ICP plasma source, is provided above the processing chamber 1. An ICP coil 34 is wound around the quartz chamber 12. A radio frequency (RF) power supply 20 for plasma generation is connected to the ICP coil 34 with a matching device 22 interposed between the power supply 20 and the ICP coil 34.

The RF power has a frequency in a frequency band of several tens of megahertz, such as 13.56 MHz. The top plate 6 is provided on top of the quartz chamber 12. A gas dispersion plate 17 and a shower plate 5 are provided under the top plate 6. Process gas is supplied to the processing chamber 1 through the gas dispersion plate 17 and the shower plate 5.

The supply flow rate of the process gas is regulated by mass flow controllers 50 respectively provided for gas species. Gas distributors 51 are provided downstream of the mass flow controllers 50 to enable independent control of flow rates and compositions of gas supplied to a center portion of a discharge space 3 and of gas supplied to a circumferential edge portion of the discharge space 3, thereby enabling spatial distribution of radicals to be precisely controlled.

Although FIG. 1 illustrates the process gas as including $NH_3$, $H_2$, $CH_2F_2$, $CH_3F$, $CH_3OH$, $O_2$, $NF_3$, Ar, $N_2$, $CHF_3$, $CF_4$, $H_2O$, other gases may be used.

An exhauster 15 is connected to a lower portion of the processing chamber 1 via a vacuum exhaust pipe 16 to reduce the pressure in the processing chamber 1. The exhauster 15 may include, for example, a turbo molecular pump, a mechanical booster pump, and/or a dry pump.

A pressure governor 14 is further provided upstream of the exhauster 15 to adjust the pressure in the processing chamber 1 and the pressure in the discharge space 3.

An IR lamp unit is provided between the wafer stage 4 and the ICP plasma source to heat the wafer. The IR lamp unit primarily includes IR lamps 62 (e.g., IR lamps 62-1, 62-2, and 62-3), a reflector 63 for reflecting IR light, and an IR light permeable window 74.

The IR lamps 62 are circular lamps. Each of the IR lamps 62 emits light mainly in a range from a visible range to an infrared range (herein referred to as IR light).

Although this embodiment assumes that the apparatus has three turns of IR lamps 62, two, four, or other number of turns of lamps may be used. The reflector 63 is provided above the IR lamps 62 to reflect the IR light in a downward direction (in a direction toward the wafer).

An IR lamp power supply 64 is connected to the IR lamps 62 through an RF cut filter 25. The RF cut filter 25 prevents noise from the RF power for plasma generation from entering the IR lamp power supply 64. The IR lamp power supply 64 has a function to control the power supplied to the IR lamps 62-1, 62-2, and 62-3 independently of one another to control radial distribution of amount of heating of the wafer (some of the wirings are not shown).

The IR lamp unit includes a flow channel 75 in a center portion thereof. The flow channel 75 includes a slitted plate 78. The slitted plate 78 has multiple openings for blocking ions and electrons generated in the plasma, and allowing only neutral gas and neutral radicals to pass therethrough to cause the gas and radicals to bombard the wafer.

The wafer stage 4 includes a flow channel 39 of refrigerant for cooling the wafer stage 4. The refrigerant is supplied in circulation by a chiller 38. The wafer stage 4 also includes plate-shaped electrode plates 30 incorporated therein to electrostatically clamp the wafer 2. A direct current (DC) power supply 31 is connected to each of the electrode plates 30.

For efficient cooling of the wafer 2, He gas can be supplied to a gap between the bottom surface of the wafer 2 and the wafer stage 4. The front surface (wafer mounting surface) of the wafer stage 4 is coated with a resin, such as polyimide, to avoid damage on the bottom surface of the wafer 2 even when the wafer is heated and/or cooled while being clamped.

The wafer stage 4 further includes therein a thermocouple 70 to measure the temperature of the wafer stage 4. The thermocouple 70 is connected to a thermocouple thermometer 71.

The wafer stage 4 has at least one opening 91 for receiving fibers 92, serving as optical fibers for determining the wafer temperature. As illustrated in FIG. 1, the openings 91 for installing optical fibers are respectively provided at three locations in the wafer stage 4 to determine the temperature at three locations: at or near the center of the wafer, at or near a radially middle location of the wafer, and at or near a circumferential edge location of the wafer.

Each of the fiber installation openings 91 receives an optical fiber 92-1 and an optical fiber 92-2. The optical fiber 92-1 is used to emit IR light from an external IR light source 93 to the wafer bottom surface. The optical fiber 92-2 is used to collect IR light passing through, and reflected by, the wafer 2, and to transmit the collected IR light to a spectroscope 96.

The external IR light source 93 generates external IR light, which is transmitted to an optical path switch 94 that opens and closes the optical path. The external IR light is split into multiple beams in a light splitter 95, passes through the fiber 92-1, and is emitted to the wafer bottom surface.

The IR light absorbed and reflected by the wafer 2 is transmitted by the fiber 92-2 to the spectroscope 96. A detector 97 collects data of dependence of spectral intensity on wavelength. An optical multiplexer 98 is provided on the fiber 92-2, and performs switching to select which light is to be spectroscopically analyzed from the light at the three different measurement points: the center of the wafer, the radially middle location of the wafer, and the circumferential edge location of the wafer.

Figure 2:
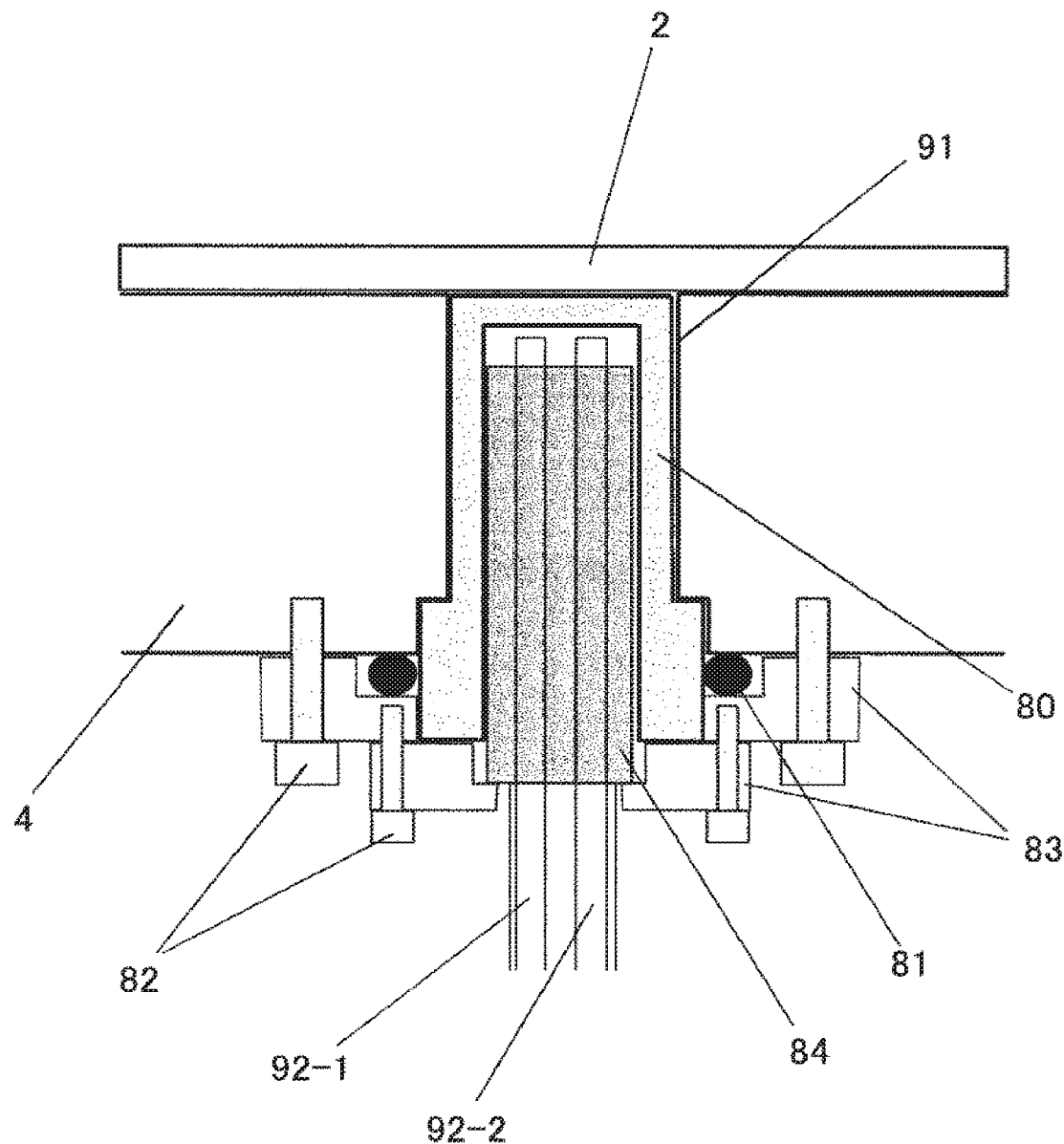
FIG. 2 is a diagram schematically illustrating an optical fiber installation opening in the embodiment of the present disclosure.

A configuration of the optical fiber installation openings 91 in the wafer stage 4 will now be described with reference to FIG. 2. FIG. 2 omits the electrode plate 30 for providing electrostatic clamping and the flow channel 39 of refrigerant.

The fiber installation opening 91 provided in the wafer stage 4 for fiber attachment is arranged perpendicular to the surface of the wafer 2. A quartz tube 80, terminated at one end thereof, is inserted in the fiber installation opening 91.

An O-ring 81 is provided between the quartz tube 80 and the wafer stage 4 to provide a hermetic seal to prevent air under the wafer stage 4 from flowing into the processing chamber 1 above the wafer stage 4. The fibers 92-1 and 92-2 are securely held in a fiber head 84, and this fiber head 84 is then inserted into the quartz tube 80, and is secured using a fixture 83 and/or other element.

Figure 3:
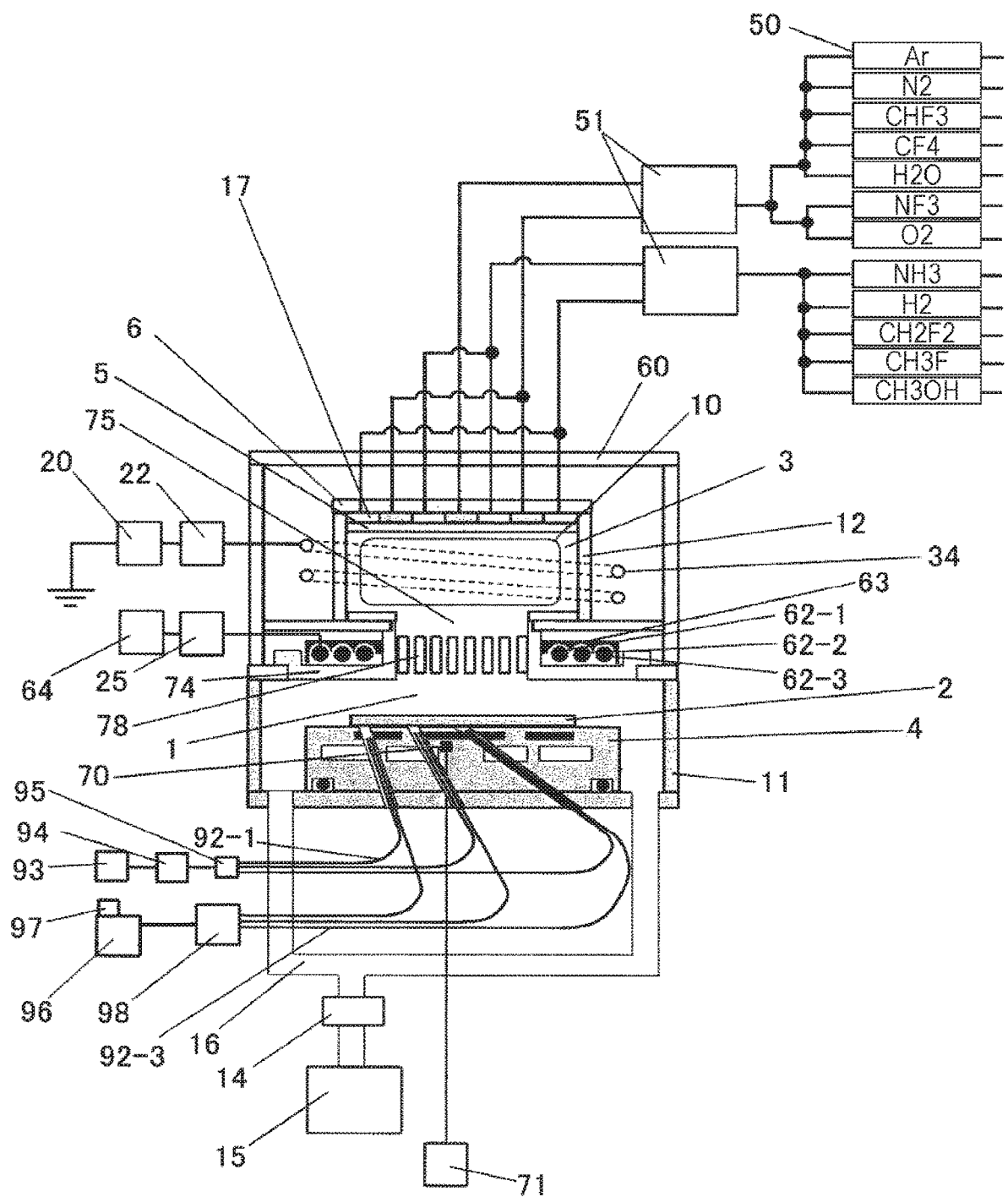
FIG. 3 is a diagram schematically illustrating another example of the plasma processing apparatus according to the embodiment of the present disclosure, having the optical fiber installation openings arranged at an angle with respect to the wafer.

The fiber installation opening 91 may be arranged at an angle with respect to the wafer plane. FIG. 3 illustrates a configuration of the plasma processing apparatus having such arrangement. FIG. 3 omits some of the elements that are identical to the elements illustrated in FIG. 1.

Figure 4:
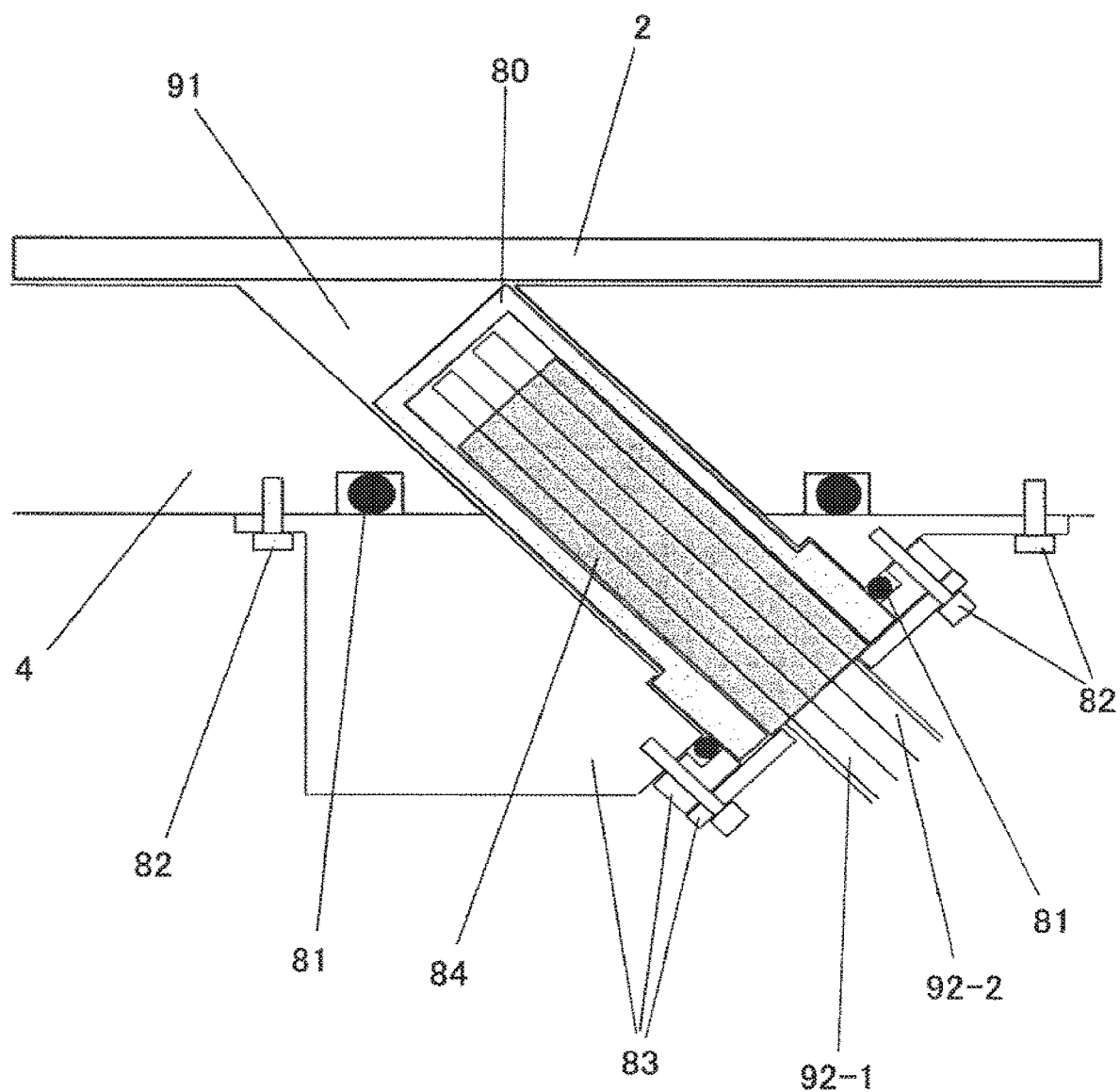
FIG. 4 is a diagram schematically illustrating an example of the optical fiber installation opening arranged at an angle with respect to the wafer in the embodiment of the present disclosure.

FIG. 4 illustrates an example configuration of a portion including the fiber installation opening 91 in this case. Similarly to the configuration illustrated in FIG. 2, a quartz tube 80 is inserted in the fiber installation opening 91, and an O-ring 81 provides sealing to prevent air from flowing into the processing chamber 1.

A fiber head 84 is inserted into the quartz tube 80.

Figure 5:
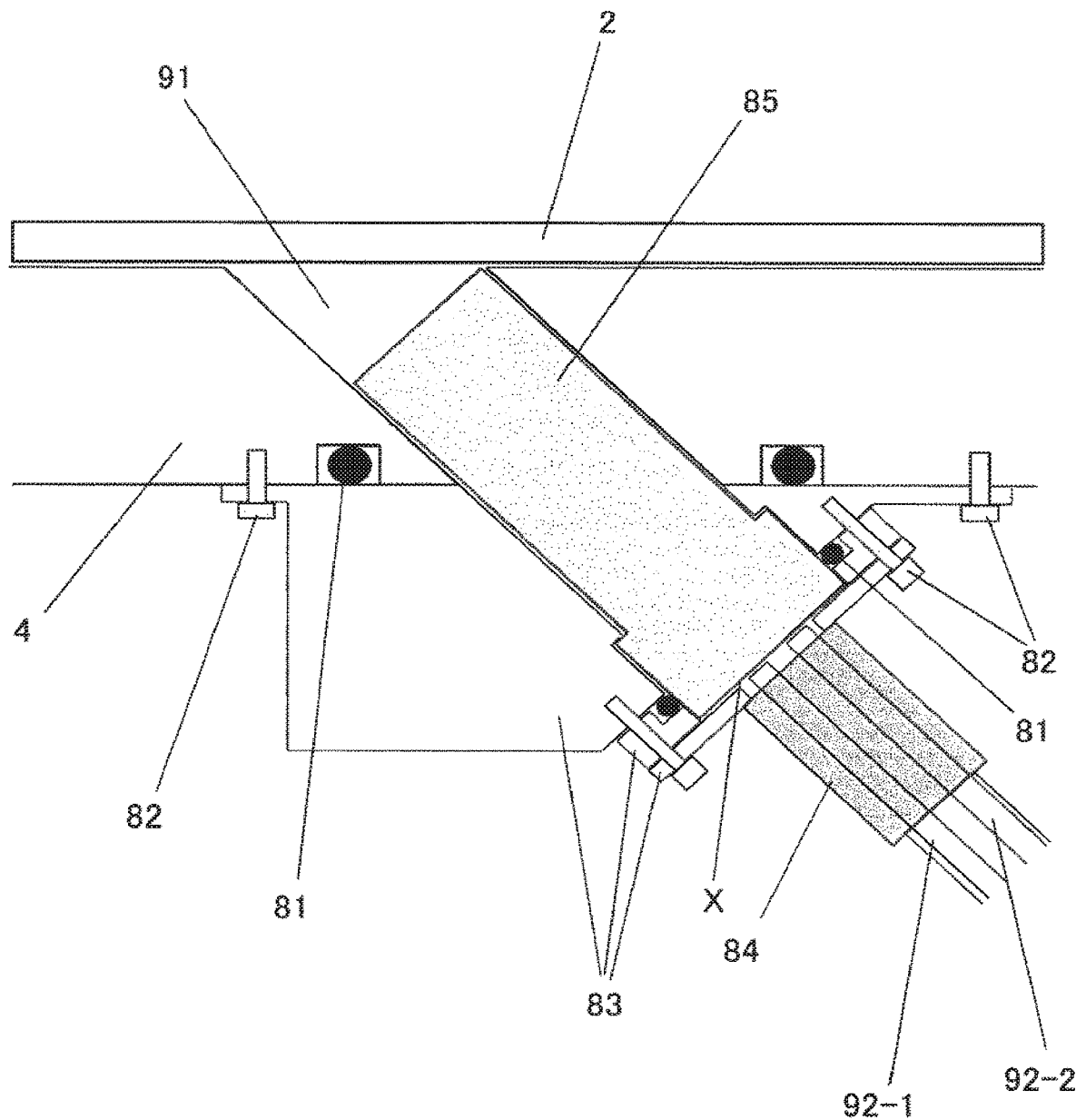
FIG. 5 is a diagram schematically illustrating another example of the optical fiber installation opening arranged at an angle with respect to the wafer in the embodiment of the present disclosure.

FIG. 5 illustrates another example configuration of a portion including the fiber installation opening 91 receiving the optical fibers 92 at an angle with respect to the wafer plane. This configuration includes a quartz rod 85 inserted in the fiber installation opening 91, and an O-ring 81 similarly prevents air from flowing into the processing chamber 1.

In this example, the fibers 92-1 and 92-2 are installed in a vicinity of one end surface (X in FIG. 5) of the quartz rod 85. The surface X of the quartz rod 85 is provided with an antireflection film.

The principle of temperature determination will next be described with reference to FIGS. 6 to 8.

Figure 6:
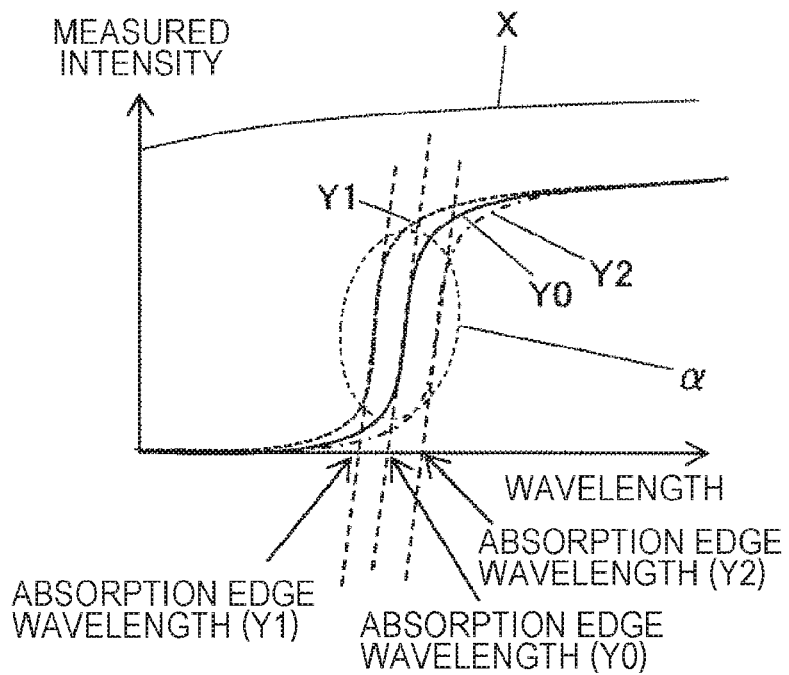
FIG. 6 is a diagram for illustrating infrared absorption edge wavelengths in the embodiment of the present disclosure.
Figure 7A:
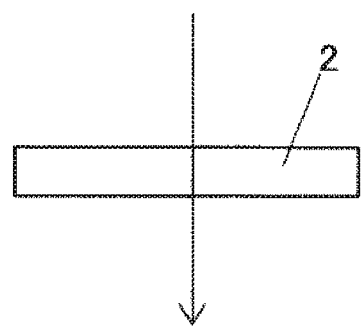
FIGS. 7A and 7B are each a diagram for illustrating an optical path of IR light in a vicinity of the wafer in an etching process in the embodiment of the present disclosure.
Figure 7B:
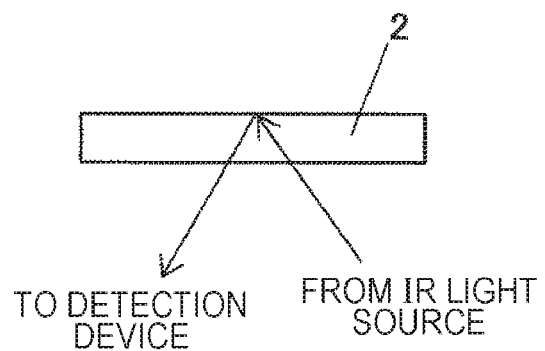
Figure 8A:
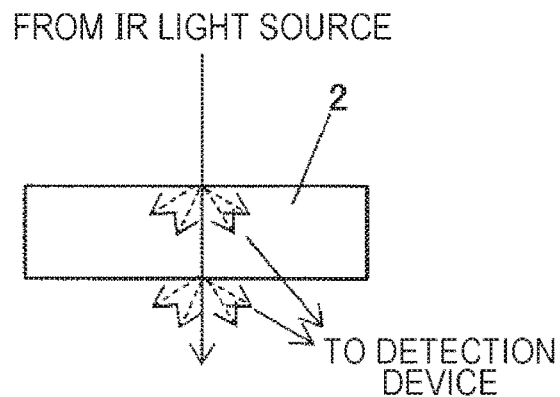
FIGS. 8A and 8B are each a diagram for illustrating another optical path of IR light in a vicinity of the wafer in an etching process in the embodiment of the present disclosure.
Figure 8B:
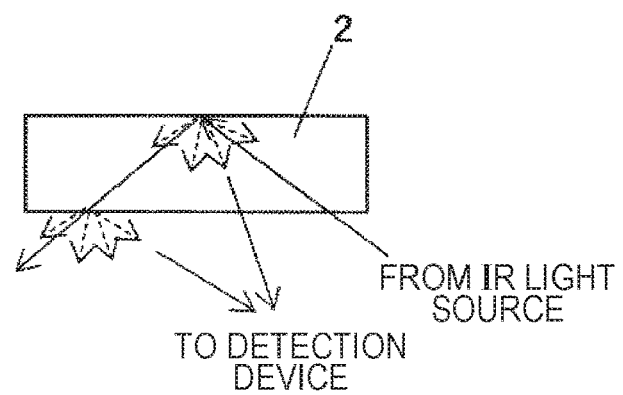

FIGS. 7A and 7B illustrate IR light passing through the wafer. FIGS. 8A and 8B illustrate IR light first entering the wafer from a surface of the wafer, reflected at an end surface of the wafer, propagating through the wafer, and finally exiting from the wafer. In either case, light having long wavelengths is absorbed in the material forming the wafer depending on the bandgap of the wafer. FIG. 6 illustrates changes in the intensity of such IR light against a change in wavelength.

As illustrated in FIG. 6, when curve X is regarded as a line indicating the intensity of IR light before entering the wafer, curves Y (Y0, Y1, and Y2) representing the intensity of light after passing through the inside of the wafer each exhibit decreases corresponding to values of the curve X and disclose profiles showing a characteristic change in a vicinity of a particular wavelength. That is, as shown in the area indicated by α in FIG. 6, the intensity of IR light rapidly increases and decreases in a wavelength range around a particular wavelength.

As far as such wavelength range is concerned, a variation in the wafer temperature causes the bandgap to vary accordingly, and hence the wavelength of the absorbed and transmitted IR light to vary accordingly. Therefore, the wavelength of the area a also varies. For example, an increase of the wafer temperature shifts the curve Y0 of FIG. 6 toward shorter wavelengths as indicated by curve Y1, while a decrease of the wafer temperature shifts the curve Y0 toward longer wavelengths as indicated by curve Y2.

The present inventors have found that utilization of such phenomenon can provide the value of wavelength in the area indicated by a, and use of the result of such wavelength value allows determination of the wafer temperature. For example, slope of the change in the intensity of IR light versus the change in the wavelength in the area a is fitted by a specific straight line, and the extrapolated value for that slope is then defined as an infrared absorption edge wavelength. With the help of correlation data, which should be previously obtained, between values of the infrared absorption edge wavelength and values of the wafer temperature, the wafer temperature can be obtained using a value of infrared absorption edge wavelength detected using the IR light output from the wafer.

In addition to the IR light illustrated in FIGS. 7A and 7B, light diffusely reflected and/or scattered at the front and/or bottom surface of the wafer 2 as indicated by the dashed arrows in FIGS. 8A and 8B may also be detected and used to determine the wafer temperature. Note that the lower intensity of the measured light of FIGS. 8A and 8B than the intensity of the light of FIGS. 7A and 7B requires the signal-to-noise ratio to be improved in a certain manner.

Figure 9:
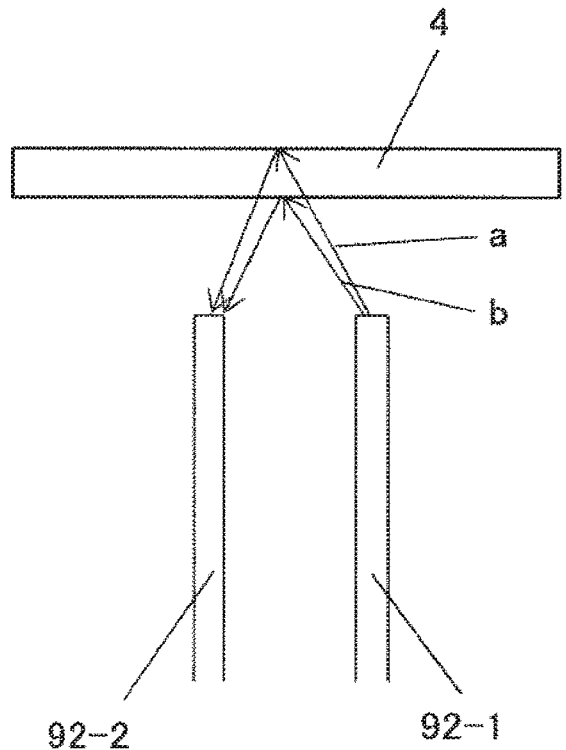
FIG. 9 is a diagram illustrating a measurement process of IR light reflected at the wafer when optical fibers are arranged perpendicular to the wafer plane in an etching process in the embodiment of the present disclosure.

Next, the angles of the fibers 92 arranged with respect to the wafer in this embodiment will be described with reference to FIGS. 9 to 11. FIG. 9 schematically illustrates paths of IR light when the wafer temperature is determined using external IR light and the fibers 92 arranged perpendicular to the wafer plane.

This embodiment utilizes the IR light that travels along the optical path "a" of FIG. 9. More specifically, this light is emitted upward from the fiber 92-1, enters the inside of the wafer 2 through the bottom surface (indicated by the lower line of the wafer 2 in FIG. 9), is reflected at the upper surface of the wafer 2 (indicated by the upper line in FIG. 9), propagates through the inside of the wafer 2, and reaches the bottom surface of the wafer 2, during which light having a particular wavelength is absorbed. The light is then emitted from the bottom surface in the downward direction, and is finally detected using the fiber 92-2 disposed under the wafer 2. Meanwhile, the IR light that travels along the optical path "b" (i.e., the IR light reflected at the bottom surface of the wafer 2 in an outward (downward in FIG. 9) direction to reach the fiber 92-2) undergoes no absorption by the wafer 2, and is therefore not useful to determine the temperature of the wafer 2. Such light is, in other words, stray light.

This shows that high accuracy detection of an infrared absorption edge wavelength that indicates the temperature of the wafer 2 requires removal, or reduction, of the component of IR light that travels along the optical path b of FIG. 9 from, or in, the IR light that reaches the fiber 92-2. However, such removal or reduction is difficult to achieve because of a need for a structure for blocking the optical path b, and a need for high accuracy adjustment of the distance between the fibers 92 and the wafer 2.

Figure 10:
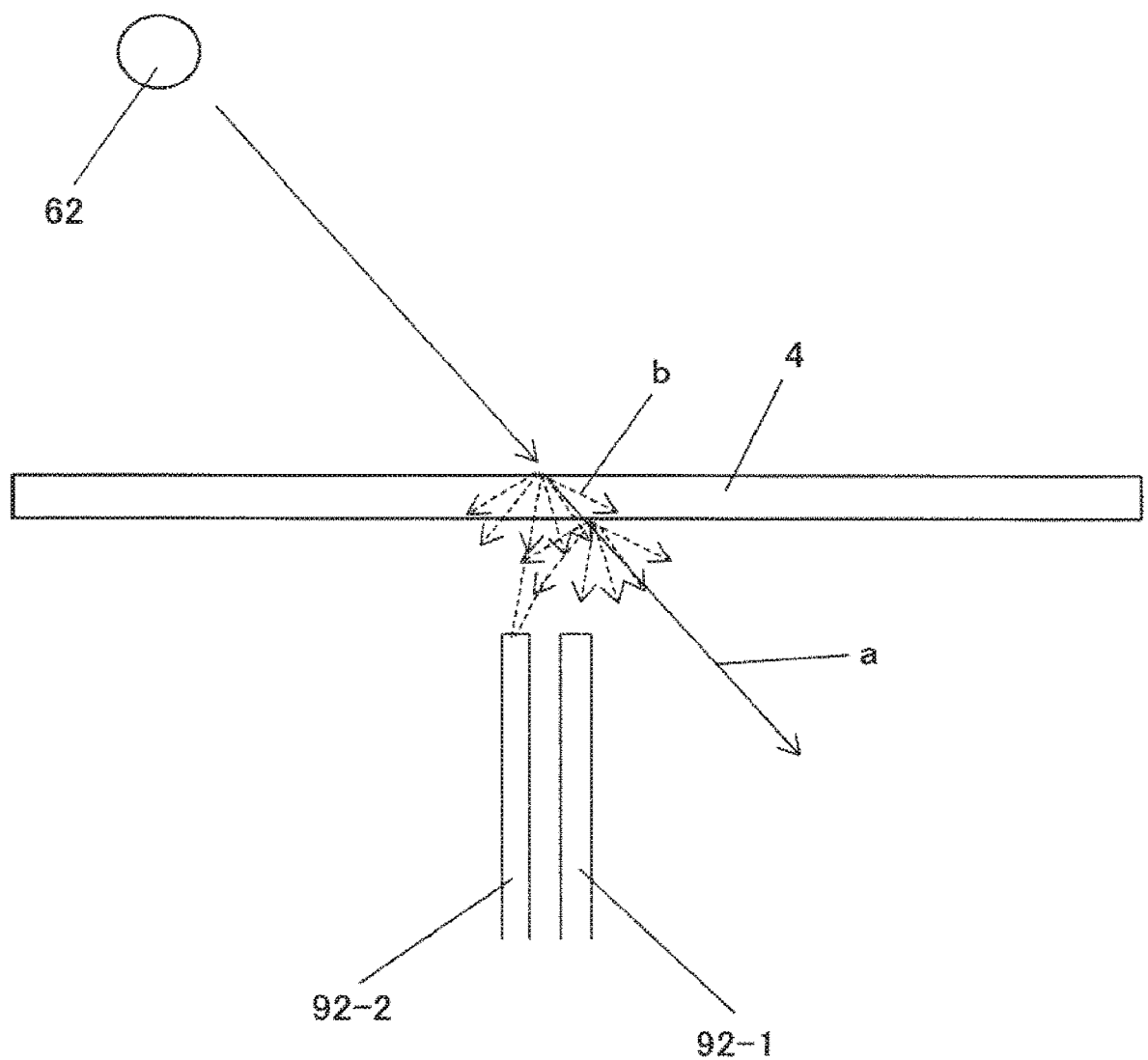
FIG. 10 is a diagram illustrating a measurement process of IR light passing through the wafer when optical fibers are arranged perpendicular to the wafer plane in an etching process in the embodiment of the present disclosure.

FIG. 10 illustrates a configuration for measurement using light from a heating IR lamp 62. As illustrated in FIG. 10, IR light from the IR lamp 62 enters the wafer 2 from an upper portion of the processing chamber 1, and passes through the wafer 2. Most of the IR light is output below the wafer 2 in parallel to the incident direction upon the wafer 2 as indicated by the optical path a of FIG. 10 (refractive indices of the wafer etc. are neglected in FIG. 10 for simplicity), while a portion of the IR light is scattered at front and bottom surfaces of the wafer 2, and thus travels along the optical paths b in various directions different from the incident direction.

IR light scattered by the upper surface of the wafer 2, passing through the inside of the wafer 2, and then output from the bottom surface of the wafer 2 can be used to determine the temperature of the wafer 2. However, the low intensity of the scattered IR light requires the IR lamp 62 to emit a sufficient intensity of IR light.

Figure 11:
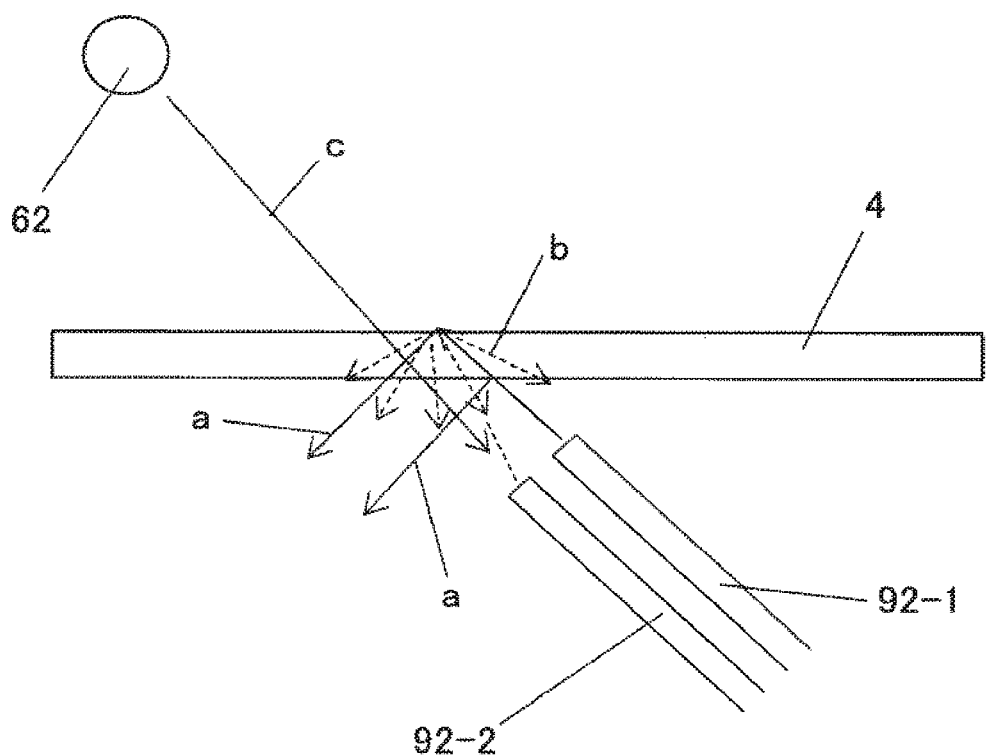
FIG. 11 is a diagram illustrating a measurement process of IR light when optical fibers are arranged at an angle with respect to the wafer plane in an etching process in the embodiment of the present disclosure.

FIG. 11 illustrates the fibers 92 arranged such that end faces or axis directions of the fibers 92 form an angle with respect to the upper surface and/or the lower surface of the wafer 2. This configuration will next be described. IR light emitted by the external IR light source 93 passes through the optical path switch 94 and the light splitter 95, and is then output from an end face of the fiber 92-1 having its axis arranged at an angle with respect to the bottom surface of the wafer 2, toward the bottom surface of the wafer 2 along the axis described above.

In the example illustrated in FIG. 11, most of the IR light emitted is reflected at the front and bottom surfaces of the wafer 2, and is then output from the wafer 2 respectively along the optical paths a at the specific reflection angle, while a portion of the IR light is diffusely reflected at the front surface of the wafer 2 as indicated by the optical paths b. IR light diffusely reflected along the optical paths b of FIG. 11 can also be used to determine the temperature of the wafer 2.

This example also requires the light source to emit light having sufficient intensity due to the lower intensity of the diffusely reflected IR light than the intensity of the IR light from the external IR light source 93 or of the IR lamps 62. On the other hand, this example provides an advantage in that IR light reflected at the bottom surface of the wafer 2, and thus traveling along the optical path a of FIG. 11 is prevented from being measured as noise.

Moreover, as illustrated in FIG. 11, the fibers 92 have their axes arranged parallel to the propagation direction of the IR light emitted from the heating IR lamp 62. This configuration enables the IR light that has passed through the wafer 2 to be more efficiently detected. Thus, the temperature of the wafer 2 can be determined using the IR light that has passed through the wafer 2 by lighting the IR lamp 62 at low power to emit light during a step not intended for heating the wafer 2 in an etching process.

In FIG. 11, the fibers 92 are configured to have their end faces and axes arranged parallel to the propagation direction of the IR light emitted from the IR lamp 62. In contrast, the end faces and the axes arranged non-parallel to the direction of the location of the IR lamp 62 can only measure weak scattered light even for the transmitted light from the heating IR lamp as illustrated in FIG. 8B, thereby making determination of the wafer temperature difficult. Accordingly, it is desirable that the fiber installation opening 91 be directed to the location of the IR lamp 62. However, such configuration complicates the structure of the wafer stage 4.

Selection of a configuration that uses light from the external IR light source 93, or a configuration that uses light from the IR lamp 62 to determine the temperature of the wafer 2, is desirably made depending on conditions such as the angle of the axes of the fibers 92 with respect to the wafer 2 and/or the IR lamp 62, and properties of the film on the surface of the wafer 2. For example, the configuration illustrated in FIG. 7A using IR light that has passed through the upper and lower surfaces of the wafer 2 provides a relatively high intensity, thereby enabling the temperature determination to be readily provided with high accuracy. In contrast, if the wafer surface is substantially covered with a metal film, such as when the film structure on the surface of the wafer 2 including the film layer to be processed has a film for forming metal wiring of a semiconductor device, IR light emitted from the IR lamp 62 above the wafer 2 is mostly reflected at the surface of the wafer 2 having that film.

This makes it difficult to determine the temperature using IR light that has passed through the wafer 2. Therefore, the apparatus desirably includes both the configuration for using IR light that has passed through the upper and lower surfaces of the wafer 2 and the configuration for using IR light that has been reflected at the surface of the wafer 2, and is desirably configured to determine the temperature of the wafer 2 using at least one of these configurations.

Figure 12:
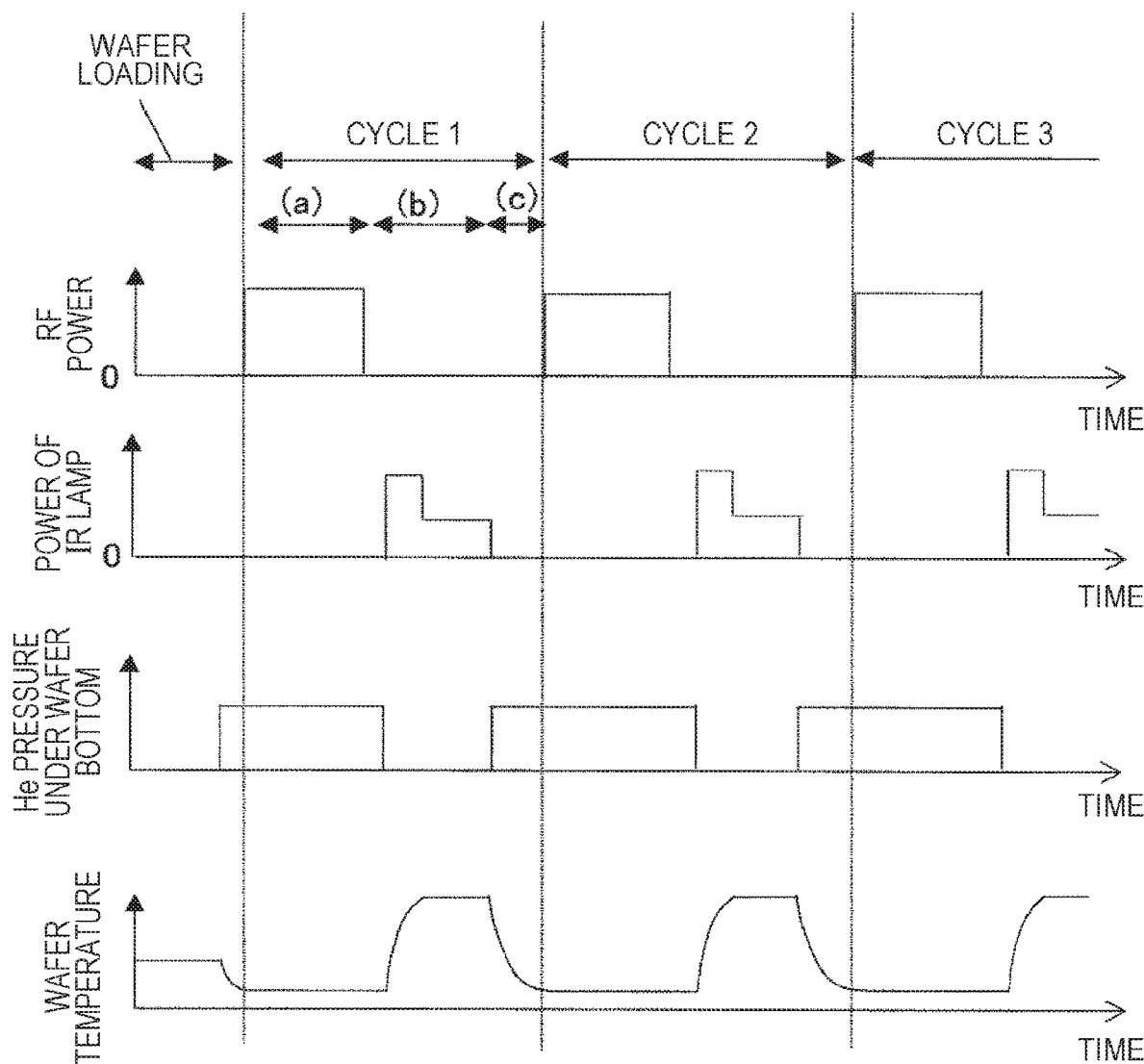
FIG. 12 is a diagram illustrating an operation procedure performed by the plasma processing apparatus in an etching process in the embodiment of the present disclosure.
Figure 13:
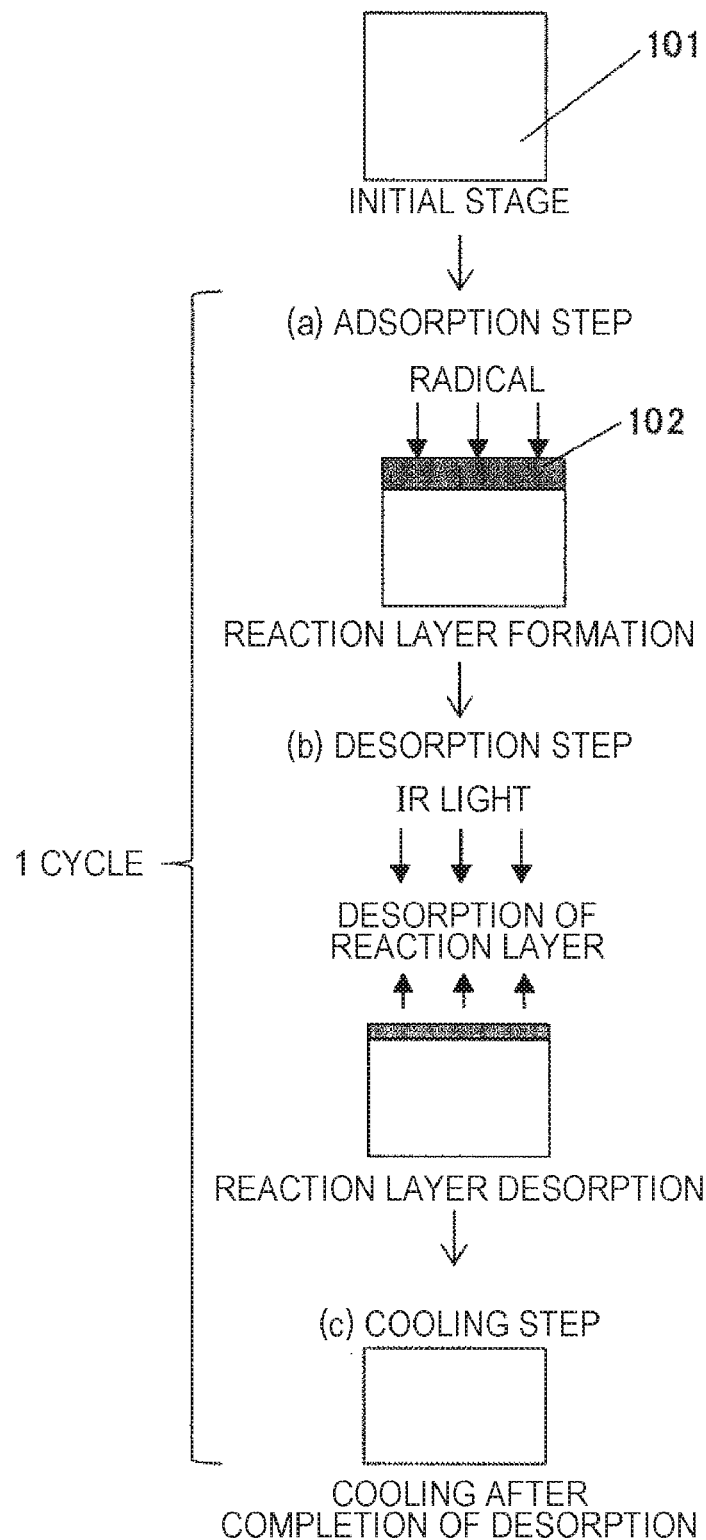
FIG. 13 is a diagram illustrating conditions of the wafer surface during etching in an etching process in the embodiment of the present disclosure.

The steps of processing the wafer 2 performed in this embodiment will next be described with reference to FIGS. 12 and 13. FIG. 12 is a timing diagram schematically illustrating an operational flow of the process performed in the embodiment of the present disclosure. FIG. 13 is a series of vertical sectional views schematically illustrating a change in the configuration, corresponding to various stages of the process, of the film structure on the wafer surface processed by the plasma processing apparatus according to the embodiment of the present disclosure.

The process illustrated in FIGS. 12 and 13 proceeds as follows. First, the wafer 2 is loaded into the processing chamber 1 through a loading inlet (not shown in FIG. 1) provided in the processing chamber 1. Next, the wafer 2 is electrostatically clamped on the wafer stage 4 using the DC power supplies 31. At the same time, He gas for cooling the wafer 2 is supplied onto the bottom surface of the wafer 2.

The flow rate of the process gas supplied to the processing chamber 1 and/or the gas composition distribution in the processing chamber 1 are then adjusted using the mass flow controllers 50 and the gas distributors 51. The discharge power supply 20 is then used to initiate plasma discharge. This causes plasma 10 to ionize and dissociate the process gas, and neutral gas and radicals pass through the slitted plate 78 to irradiate the wafer 2.

This causes the radicals to adsorb on the surface of the wafer to form the reaction layer 102 on top of the etched layer 101 (adsorption step, see section (a) in FIG. 12 and step (a) of FIG. 13). This embodiment assumes that the etched layer 95 is a film layer formed of Si, $SiO_2$, SiN, SiGe, W, TiN, TiO, $Al_2O_3$, and/or the like.

After the reaction layer has been formed, the discharge power supply 20 is turned off to terminate plasma discharge. Supply of He gas onto the wafer bottom surface is also terminated, and a valve 52 (see FIG. 1) is opened to allow the pressure under the bottom surface of the wafer 2 to be comparable to the pressure in the processing chamber 1 (i.e., discharge the He gas under the wafer bottom surface).

Next, the IR lamp power supply 64 is turned on to turn the IR lamps 62 on. IR light emitted from the IR lamps 62 passes through the IR light permeable window 74, and heats the wafer 2.

When the wafer temperature reaches a specific temperature, the output power of the power supply 64 is reduced to maintain the temperature of the wafer 2 at a constant level to allow the modified layer to desorb (desorption step) (see section (b) of FIG. 12 and step (b) of FIG. 13).

Next, the IR lamp power supply 64 is turned off to terminate heating of the wafer 2. Then, He gas is supplied onto the wafer bottom surface while Ar gas is supplied into the processing chamber 1 to start cooling of the wafer 2 (see section (c) of FIG. 12 and step (c) of FIG. 13).

When the cooling step completes, radical exposure is initiated (in the next cycle). Thus, a cycle of radical adsorption and desorption is repeated to perform an etching operation step by step.

Electrostatic clamping is maintained during the etching operation of the wafer 2 performed by repeating the sequence of steps described above. When the etching operation completes, electrostatic clamping is terminated (electrostatic removal), and the wafer 2 is then unloaded from the processing chamber 1.

Figure 14:
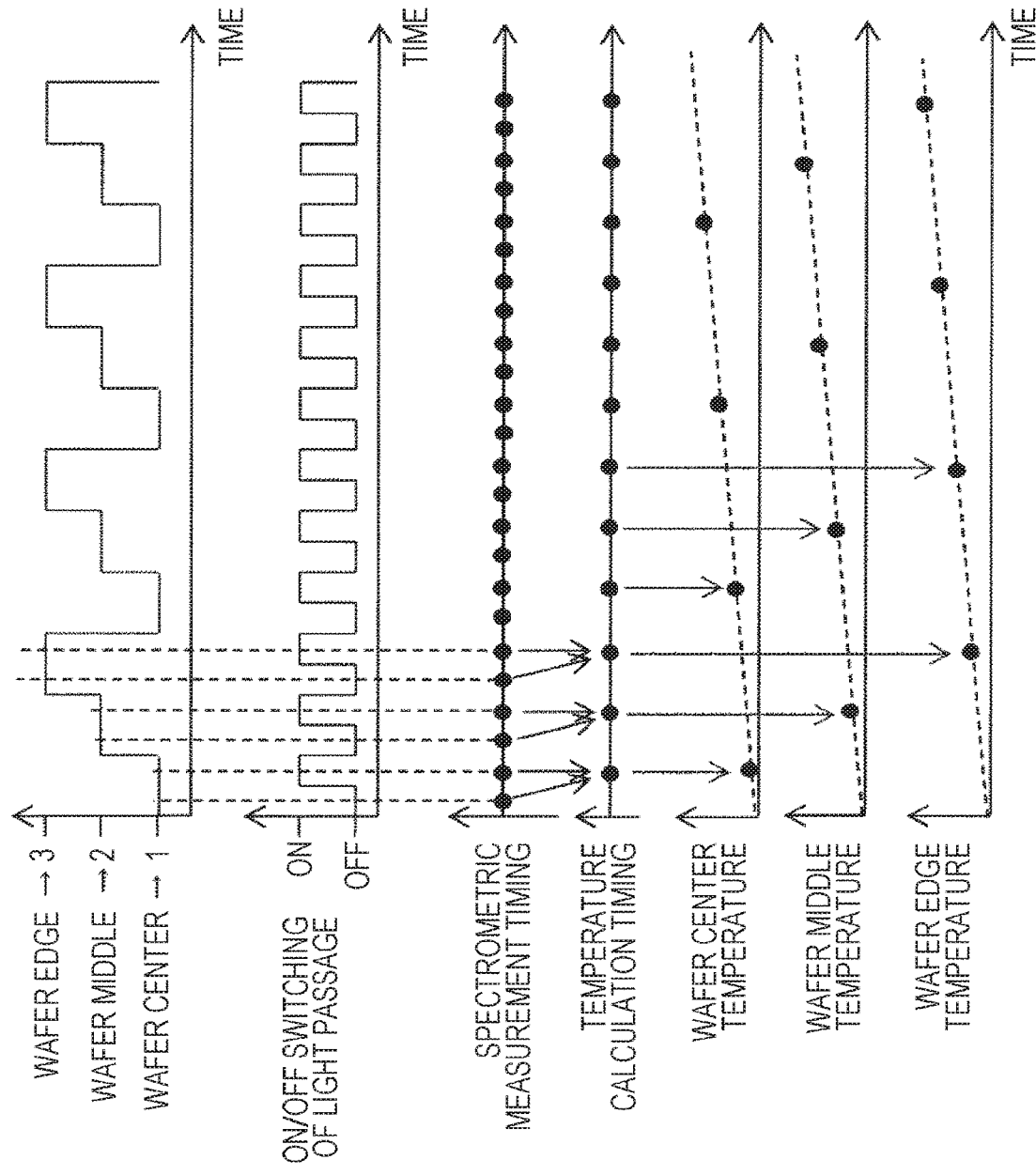
FIG. 14 is a diagram for illustrating a procedure for determining the wafer temperature using external IR light in an etching process in the embodiment of the present disclosure.

The step of determining the wafer temperature using an external IR light source in this embodiment will next be described with reference to FIG. 14. FIG. 14 is a timing diagram illustrating an operational flow of determining the wafer temperature using external IR light in an etching process in this embodiment.

As illustrated in FIG. 14, the plasma processing apparatus of this embodiment first switches the channel of the optical multiplexer 98 to spectroscopically analyze the light collected in a center portion of the wafer 2. The optical path switch 94 is then switched between "on" and "off" to measure respective wavelength profiles of the intensity of the IR light during the "on" and "off" states.

In this embodiment, when the optical path switch 94 is in an "on" state, two IR light signals of the IR light from the external IR light source 93 and the IR light from the heating IR lamps 62 are measured; while when the optical path switch 94 is in an "off" state, only the signal of IR light from the IR lamps 62 is measured. Then, the wavelength profile of high intensity of the IR light in an "off" period of the optical path switch 94 is subtracted from the wavelength profile of high intensity of the IR light in an "on" period of the optical path switch 94 to extract the wavelength profile corresponding only to the IR light from the external IR light source 93.

An infrared absorption edge wavelength is then calculated using the extracted wavelength profile, as illustrated in FIG. 6. Using data previously obtained before processing of the wafer 2, that represents correlation between the values of the infrared absorption edge wavelength and the wafer temperature, the wafer temperature value corresponding to the wavelength value in the data closest to the calculated infrared absorption edge wavelength is determined as the temperature of the wafer 2 being processed. Next, the channel of the optical multiplexer 98 is switched to the channel corresponding to light collected in a middle portion of the wafer 2, and the temperature in a middle portion of the wafer 2 is determined in a similar procedure.

Then, the temperature of a circumferential edge portion of the wafer 2 is determined similarly, followed by another step of determination of the temperature in the center portion of the wafer 2. In this manner, the temperature of the wafer 2 is sequentially determined at the center, at the middle location, at the circumferential edge, at the center, at the middle location, at the circumferential edge, . . . of the wafer 2 by sequentially switching the channels of the optical multiplexer 98 and repeating turning the optical path switch 94 on and off.

Figure 15:
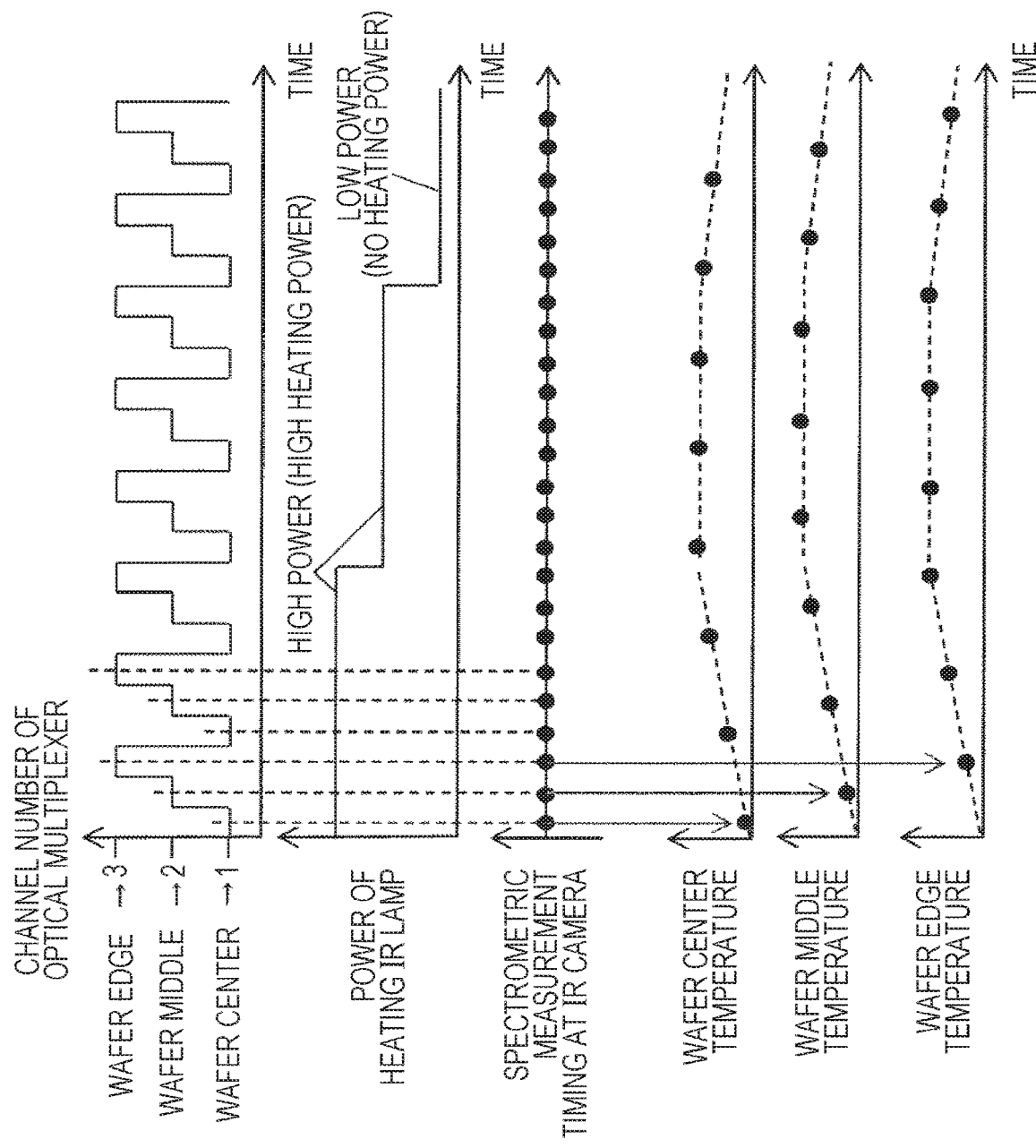
FIG. 15 is a diagram for illustrating a procedure for determining the wafer temperature using a heating IR lamp in an etching process in the embodiment of the present disclosure.

A procedure, in this embodiment, to determine the temperature of the wafer 2 only using IR light from the heating IR lamps 62 without using IR light from the external IR light source 93 will next be described with reference to FIG. 15. FIG. 15 illustrates a procedure to determine the temperature during heating and cooling of the wafer 2.

By switching the channels of the optical multiplexer 98 sequentially targeting the center, the middle location, and the circumferential edge of the wafer 2, light from the IR lamps 62 that has passed through the wafer 2 is spectroscopically analyzed for each channel to estimate the wafer temperature from the infrared absorption edge wavelength.

When a termination of a predetermined period of heating the wafer 2 is detected, or when reaching a predetermined temperature by the wafer 2 is detected, the heating step is terminated and the step of cooling of the wafer 2 is initiated. In this cooling step, the output power of the heating IR lamps 62 is reduced to maintain the IR lamps 62 lit at low power. The power of the IR lamps 62 during this cooling period is adjusted so that the signal intensity determined in the spectroscopic analysis exceeds a value of 1 in terms of the signal-to-noise ratio.

The IR lamps 62 include three turns of IR lamps each of which are arranged in concentric, and it may be configured to light only one turn of the three IR lamps 62 at low power. Moreover, one turn of the IR lamps 62 may be configured such that multiple arc-shaped lamps are arranged. For example, if eight arc-shaped lamps each having a central angle slightly smaller than 45 degrees are arranged at a same radial distance to constitute one turn of lamp unit, a combination of only any one to seven of the arc-shaped lamps may be lit.

Figure 16:
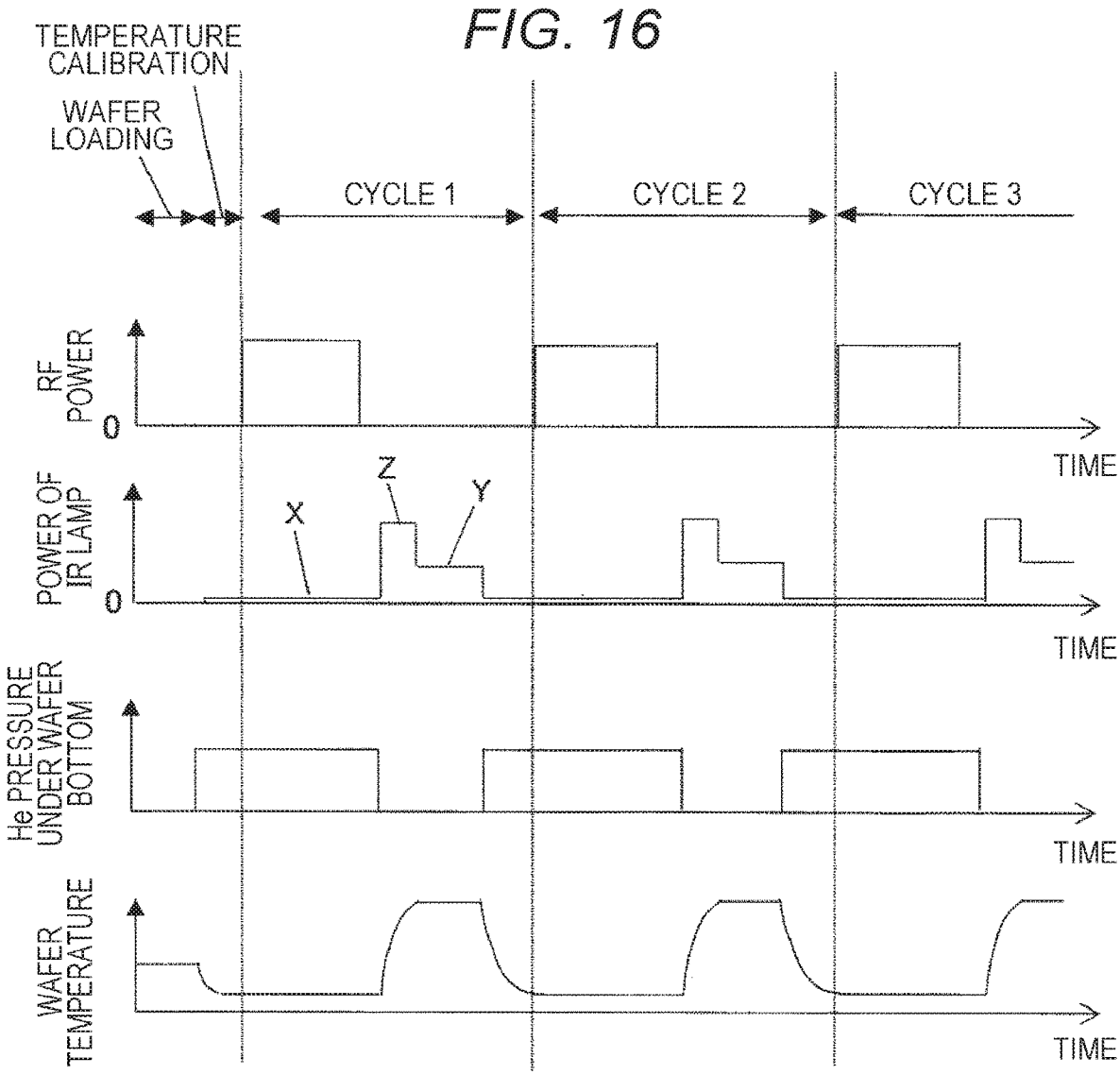
FIG. 16 is a diagram for illustrating a process flow of determining the wafer temperature using light from the heating IR lamp in an etching process in the embodiment of the present disclosure.

FIG. 16 illustrates an example of an operational flow when the temperature of the wafer 2 is determined using IR light from the IR lamps 62 in the processing of the wafer 2 performed in this embodiment. More specifically, the IR lamps 62 are lit at low power during radical exposure and during cooling of the wafer 2, while IR lamps 62 are lit at power needed to heat the wafer 2 during heating.

During cooling and during radical exposure, while the wafer 2 is electrostatically clamped on the wafer stage 4, and He gas is supplied onto the bottom surface of the wafer 2, the IR lamps 62 are lit at low power to reduce or prevent a temperature rise of the wafer 2.

Figure 17:
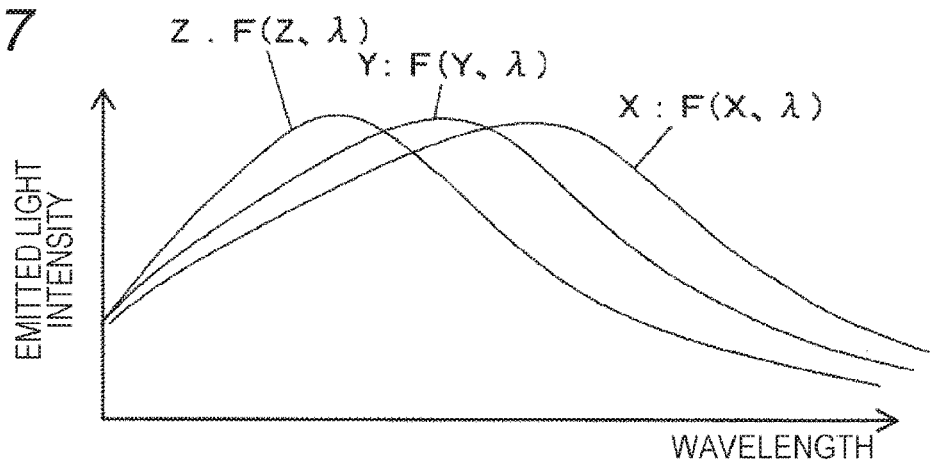
FIG. 17 is a diagram for illustrating wavelength profiles of IR light emitted from the heating IR lamp in an etching process in the embodiment of the present disclosure.

The temperature calibration technique in a configuration for determining a temperature in this embodiment will next be described with reference to FIG. 17. FIG. 17 is a diagram for illustrating wavelength profiles of IR light emitted from the heating IR lamps 62 in an etching process in the embodiment of the present disclosure.

The wavelength profile of the intensity of light emitted from an IR light source usually varies depending on lighting power. Lower power typically shifts the profile graph toward longer wavelengths, which indicates lower color temperature.

For example, lighting the IR lamps 62 at low power (power X of FIG. 16) for determining the temperature as illustrated in FIG. 15 generates a wavelength profile represented by curve X in FIG. 17, while a wavelength profile becomes as illustrated by curve Z of FIG. 17 during increase in the temperature of the wafer 2 (power Z of FIG. 16), and becomes as illustrated by curve Y of FIG. 17 when the temperature of the wafer 2 is maintained constant or controlled to be unchanged (power Y of FIG. 16).

That is, the wavelength profile of the intensity of IR light emitted from the IR lamps 62 varies depending on when the temperature is determined. Therefore, before loading of the wafer 2 into the processing chamber 1, this embodiment causes multiple different values of power to be supplied to the IR lamps 62 to light the IR lamps 62 to provide various outputs corresponding to the respective values of power, and this embodiment thus obtains, in advance, data of wavelength profiles of spectroscopic analysis intensity as illustrated in FIG. 17.

After this, the wafer 2 is loaded into the processing chamber 1, and is electrostatically clamped and held on the wafer stage 4. He gas is then supplied onto the bottom surface of the wafer 2. Under these conditions, the IR lamps 62 are supplied with low power and are lit for temperature determination.

Thereafter, the temperature of the wafer 2 reaches the temperature of the wafer stage 4 or a similar temperature that may be deemed to be that temperature. In this situation, the temperature of the wafer 2 is the same as, or similar to, the temperature determined by an output of the thermocouple thermometer 71 for measuring the temperature of the wafer stage 4.

An infrared absorption edge wavelength is then determined using IR light from the IR lamps 62 as described above. Data that associates the extracted infrared absorption edge wavelength with the temperature measured by the thermocouple thermometer 71 is then stored in a storage device (not shown), such as a memory, a hard disk drive, or the like. When the IR lamps 62 are lit at low power (i.e., temperature determination mode) during radical exposure and during cooling of the wafer 2, the temperature of the wafer 2 is calculated as a value relative to the measured value.

Then, during wafer heating (i.e., in a temperature rise and at a constant temperature), the wavelength profile obtained in each of the situations is calibrated based on the wavelength profile of light intensity of the IR lamps 62. For example, in connection with the wavelength profiles illustrated in FIG. 17, let F(X, λ) be a value measured in the temperature determination mode, F(Z, *λ) be a value measured during temperature rise, and F(Y, λ) be a value during a constant temperature. Moreover, for example, let H(Z, λ) be the profile determined during wafer heating (temperature rise), and let G(Z, λ) be the calibrated wavelength profile. The calibrated wavelength profile can then be calculated using the equation:

$$G(Z,\lambda)=H(Z,\lambda)\cdot F(X,\lambda)/F(Z,\lambda)$$

The G(Z, λ) obtained can be used to calculate the absorption edge wavelength for calibration.

Simply put, calibration can be made by a calculation: [measured value of wavelength profile during wafer heating]×[wavelength profile determined in the temperature determination mode without wafer]/[wavelength profile determined with the IR lamps lit at same power without wafer], and the temperature of the wafer can then be calculated as a value relative to the temperature measured by the thermocouple thermometer.

Although the foregoing describes a temperature calibration technique when the temperature is determined using the heating IR lamp, the wafer temperature can also be determined using the external IR light as follows. After the wafer is loaded, and when the wafer temperature becomes the same as, or similar to, the wafer stage temperature, the temperature is estimated using the infrared absorption edge wavelength, and comparison is made between the estimated temperature and the temperature measured by the thermocouple thermometer to calibrate the temperature.

Furthermore, temperature determination using the external IR light may use two sets of information including the wafer temperature calculated by removing the effects of the heating IR light, and the wafer temperature calculated using only IR light from the heating IR lamp, to manage the process of the apparatus. More specifically, the wafer temperature determined may be used for adjustment of heating duration, adjustment of power ratio between the three turns of the IR lamps 62 (i.e., innermost 62-1, middle 62-2, and outermost 62-3), and/or adjustment of cooling duration may be provided.

What is claimed is:

1. A method of processing a semiconductor wafer comprising:
    locating the semiconductor wafer on an upper surface of a sample stage disposed in a lower portion of a processing chamber inside a vessel;
    supplying a process gas into the processing chamber;
    absorbing particles generated by the process gas on a film disposed on an upper surface of the wafer to generate a product layer;
    desorbing the product layer, after the absorbing step, by heating the wafer using infrared (IR) light emitted from a lamp disposed above the sample stage;
    detecting IR light exiting from a rear surface of the wafer from an upper and out of a rear surface thereof, during a period in which the emission of the IR light by the lamp is lowered so that the product layer is not desorbed, after having passed through an inside of the semiconductor wafer, using a detector disposed below the upper surface of the sample stage, and detecting a characteristic change of intensities of the IR light in a plurality of wavelengths thereof;
    determining a temperature of the semiconductor wafer using a result of detecting a wavelength of the IR light in which the characteristic change occurred and data which is obtained before the processing of the semiconductor wafer and indicating a relationship between the temperature of the semiconductor wafer and the wavelength of the IR light in which the characteristic change occurred; and
    adjusting the temperature of the semiconductor wafer using the value obtained by the step of determining the temperature of the semiconductor wafer.

2. The method of processing a semiconductor wafer according to claim 1,
    wherein the temperature of the semiconductor wafer is determined based on the result of detecting the characteristic change of the intensities of IR light obtained from differences of between intensities of IR light which are detected during illumination by a light source and intensities of IR light detected when the light source is off.

3. The method of processing a semiconductor wafer according to claim 1,
    wherein the temperature of the semiconductor wafer is determined based on the result of detecting the characteristic change of intensities of IR light which illuminates the semiconductor wafer through a hole in the sample stage from a light source disposed below the upper surface of the sample stage, and which passes through the inside of the semiconductor wafer, and which is detected by the detector.

4. The method of processing a semiconductor wafer according to claim 1,
    wherein the IR light which is emitted from the lamp is detected by the detector before or after the desorbing step.

5. The method of processing a semiconductor wafer according to claim 1,
    wherein the temperature of the semiconductor wafer is determined based on the result of detecting the characteristic wavelength of IR light in which the intensities of IR light characteristically changes, the characteristic wavelength altering according to the temperature of the semiconductor wafer.

* * * * *